US009292425B2

(12) United States Patent
Choi et al.

(10) Patent No.: US 9,292,425 B2
(45) Date of Patent: Mar. 22, 2016

(54) SEMICONDUCTOR MEMORY DEVICE WITH OPERATION FUNCTIONS TO BE USED DURING A MODIFIED READ OR WRITE MODE

(71) Applicant: SAMSUNG ELECTRONICS CO., LTD., Suwon-si, Gyeonggi-do (KR)

(72) Inventors: Hyojin Choi, Suwon-si (KR); Chulwoo Park, Yongin-si (KR); Uksong Kang, Seongnam-si (KR); Haksoo Yu, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 194 days.

(21) Appl. No.: 13/966,585

(22) Filed: Aug. 14, 2013

(65) Prior Publication Data

US 2014/0075135 A1    Mar. 13, 2014

(30) Foreign Application Priority Data

Sep. 11, 2012    (KR) .................. 10-2012-0100513

(51) Int. Cl.
*G06F 12/00* (2006.01)
*G11C 7/10* (2006.01)
*G11C 11/4076* (2006.01)

(52) U.S. Cl.
CPC .............. *G06F 12/00* (2013.01); *G11C 7/1006* (2013.01); *G11C 11/4076* (2013.01)

(58) Field of Classification Search
None
See application file for complete search history.

(56) References Cited

U.S. PATENT DOCUMENTS

| 5,953,738 | A  | * | 9/1999  | Rao ............................. 711/105 |
| 6,959,367 | B2 | * | 10/2005 | Banno ......................... 711/155 |
| 7,707,387 | B2 |   | 4/2010  | Bittner, Jr. |
| 7,724,587 | B2 |   | 5/2010  | Song et al. |
| 8,060,724 | B2 |   | 11/2011 | Moyer |
| 2012/0102275 | A1 |   | 4/2012  | Resnick |

FOREIGN PATENT DOCUMENTS

| JP | 2005-322251 | 11/2005 |
| KR | 1020050063202 | 6/2005 |
| KR | 1020080011682 | 2/2008 |

(Continued)

OTHER PUBLICATIONS

Oruc; Yavuz, VESP Computer, 2008, University of Maryland Department of Electrical and Computer Engineering, http://www.ece.umd.edu/~yavuz/teaching/courses/enee350/vesp-source-code/vesp1.0.htm.*

*Primary Examiner* — Reginald Bragdon
*Assistant Examiner* — Edward Wang
(74) *Attorney, Agent, or Firm* — F. Chau & Associates, LLC

(57) ABSTRACT

A semiconductor memory device performs a modified read operation or a modified write operation. The semiconductor memory device includes a memory cell array, a read circuit, and a write circuit. The semiconductor memory device further includes an operation unit performing an operation on read data obtained by the read circuit according to operation assignment information applied through an address line to reduce memory access time when entering a modified read mode. In addition, the semiconductor memory device may optionally manage a normal read mode and the modified read mode and allow operation result data output from the operation unit to be written by the write circuit in the modified read mode.

6 Claims, 11 Drawing Sheets

(56) References Cited

FOREIGN PATENT DOCUMENTS

| | | |
|---|---|---|
| KR | 1020090010422 | 1/2009 |
| KR | 1020110055629 | 5/2011 |
| WO | WO2010044242 | 4/2010 |

\* cited by examiner

Fig. 8

| A[2:0] | Operations | Example |
|---|---|---|
| 000 | Normal Command | - |
| 001 | Operation1 | ☐ Arithmetic Operation: |
| 010 | Operation2 | · INC,DEC,ADD,SUBTRACT, |
| ... | ... | ,×,÷,etc. |
| 111 | Operation7 | ☐ Logical Operation: · AND,OR,NOR,NAND,EXOR, INVERT,SHIFT,etc. |

Fig. 9

| | MRS | Modes | Remark |
|---|---|---|---|
| M1 | 000 | Normal Read | Read |
| M2 | 001 | First Modified Read | (1 Time Access) Read-Modify-Write |
| M3 | 010 | Second Modified Read | (1 Time Access) Read-Modify-Write |
| M4 | 011 | Normal Write | Write |
| M5 | 100 | Modified Write | (1 Time Access) Read-Modify-Write |
| | ⋮ | ⋮ | ⋮ |

SEMICONDUCTOR MEMORY DEVICE WITH OPERATION FUNCTIONS TO BE USED DURING A MODIFIED READ OR WRITE MODE

CROSS-REFERENCE TO RELATED APPLICATIONS

This application claims priority under 35 USC §119 to Korean Patent Application No. 10-2012-0100513, filed on Sep. 11, 2012, the disclosure of which is incorporated by reference in its entirety herein.

TECHNICAL FIELD

Exemplary embodiments of the inventive concept relates to semiconductor memory devices and, more particularly, to a semiconductor memory device with operation functions to reduce memory access time.

DISCUSSION OF RELATED ART

A semiconductor memory device such as a dynamic random access memory (hereinafter, referred to as "DRAM") may be connected to a processor or a memory controller to store or output data.

A read-operate-write (e.g., a read-modify-write) sequence performed by the processor may include a step of reading data stored in the DRAM, a step of performing an operation on the read data in the processor, and a step of writing a result of the operation into the DRAM. Accordingly, the read-operate-write operation sequence requires at least two memory accesses.

In a shared-memory multi-core (or multi-thread) system, read-operate-write operations may occur during synchronization between cores (or threads). However, atomicity must be sufficiently ensured during the synchronization.

SUMMARY OF THE INVENTION

At least one embodiment of the inventive concepts provides a volatile memory device with operation functions, which may reduce memory access time.

At least one embodiment of the inventive concept provides a semiconductor memory device capable of responding to multiple commands.

According to an exemplary embodiment of the inventive concept, a semiconductor memory device includes a memory cell array including a plurality of memory cells (e.g., arranged in a matrix form of rows and columns); a read circuit configured to read data from selected memory cells in the memory cell array; a write circuit configured to write data into selected memory cells in the memory cell array; an operation unit configured to perform an operation on read data obtained by the read circuit according to operation assignment information applied through an address line when entering a modified read mode; and a control circuit configured to manage a normal read mode and the modified read mode and allow operation result data output from the operation unit to be written by the write circuit into the selected memory cells in the modified read mode. Optionally, the control circuit may be configured to manage only the modified read mode or only the normal read mode.

In an exemplary embodiment, read-operate-write operations performed in the semiconductor memory device may be internally performed by executing a memory access operation once. For example, a read-operate-write operation may be performed internally within the semiconductor memory device in response to a single request from an external source. For example, the single request may include a command (e.g., a modified read command) and an address (e.g., indicating a location of a first operand and a particular operation), and optional data (e.g., a second operand).

In an exemplary embodiment, entering the modified read mode may be accomplished using one of mode register set timing, fuse programming, NVM programming, and bonding options.

In an exemplary embodiment, during the modified read mode, a second input address identifying an operator is received (e.g., following the lapse of a CAS latency time) after a first input address indicating a read address storing a first operand to be applied to the operation unit is received.

In an exemplary embodiment, the operation result data may be directly written into memory cells indicated by the first input address, be written memory cells indicated by some of the second input address, or be written into an internal register of the semiconductor memory device.

In an exemplary embodiment, data output to an external entity through the read circuit may be the read data or the operation result data.

In an exemplary embodiment, during the modified read mode, a second input address identifying an operator and indicating an address storing a second operand is received after a first input address indicating an address storing a first operand to be applied to the operation unit is received.

In an exemplary embodiment, except for the operator, the others of the second input address may indicate a column offset with respect to the first input address and may be a modifiable set value or a pre-defined mode register set value. For example, the second input address may include a first that identifies the operator and a second other part that indicates the address storing the second operand, where the second part is a column offset with respect to the first input address.

In an exemplary embodiment, the operation result data may be directly written into memory cells indicating the first input address or be written into memory cells spaced apart from the second input address as far as the column offset.

In an exemplary embodiment, the operation assignment information may include a plurality of arithmetic operators and a plurality of logical operators.

According to an exemplary embodiment of the inventive concept, a semiconductor memory device includes a memory cell array including a plurality of memory cells (e.g., arranged in a matrix form of rows and columns); a read circuit configured to read data from selected memory cells in the memory cell array; a write circuit configured to write data into selected memory cells in the memory cell array; an operation unit configured to perform an operation on read data obtained by the read circuit and input write data according to operation assignment information applied through an address line when entering a modified write mode; and a control circuit configured to manage a normal write mode and the modified write mode and allow operation result data output from the operation unit to be written by the write circuit into the selected memory cells in the modified write mode. Optionally the control circuit manages only the normal write mode or only the modified write mode.

In an exemplary embodiment, a column address indicating an address of a first operand to be applied to the operation unit and identifying an operator may be received in the modified write mode.

In an exemplary embodiment, a lower three bits of the column address may identify the operator and the other bits of the column address may identify an address storing the first operand.

In an exemplary embodiment, the operation result data may be directly written into memory cells indicated by an address of the first operand or be written into a multi-purpose register of the semiconductor memory device.

In an exemplary embodiment, the operation assignment information may include at least one selected from the group consisting of a plurality of arithmetic operators and a plurality of logical operators. For example, the operation assignment information may include an arithmetic or logical operator.

According to an exemplary embodiment of the invention, a memory system includes a memory controller and a memory device. The memory controller is configured to output one of a normal read command and a modified read command, and an address. The memory device includes a memory array. The memory device is configured to perform one of i) reading data from the memory array and outputting the read data to the memory controller in response to the normal read command, and ii) reading data from the memory array, performing an operation on the read data and an operand to generate a result, and writing the result to the memory array in response to the modified read command.

In an exemplary embodiment, when the modified read command is output, the address identifies the operation and a location within the memory array that stores the operand. In an exemplary embodiment, the memory controller outputs a second operand and the performing performs the operation on the first and second operands.

In an exemplary embodiment, the address includes a first address that identifies the operation and a second address that identifies the location, and the memory controller outputs the second address after a column address strobe latency period has elapsed after outputting the first address. In an exemplary embodiment, the memory device stores a table of entries, each entry include a distinct bit pattern corresponding to a different operation, and the address includes one of the bit patterns.

BRIEF DESCRIPTION OF THE DRAWINGS

FIG. 8 is an exemplary diagram of an operator table to assign operation assignment information in the memory system of FIG. 1 according to an exemplary embodiment of the inventive concept.

FIG. 9 is an exemplary diagram of an operation mode table to assign memory operation modes in the memory system of FIG. 1 according to an exemplary embodiment of the inventive concept.

DETAILED DESCRIPTION

Figure 1:
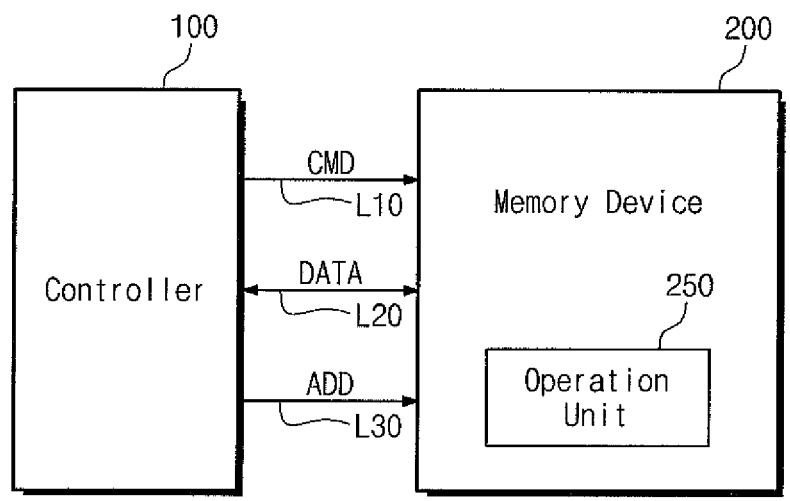
FIG. 1 is a schematic block diagram of a memory system according to an exemplary embodiment of the inventive concept.

The inventive concept will be apparent from the following exemplary embodiments, which are described in more detail with reference to the accompanying drawings. It should be noted, however, that the inventive concept is not limited to the following exemplary embodiments, and may be implemented in various forms.

In the specification, it will also be understood that when an element or lines are referred to as being "on" a target element block, it can be directly on the target element block, or intervening another element may also be present. In the drawings, thicknesses of elements may be exaggerated for clarity of illustration.

As used in the specification, the singular forms "a", "an" and "the" are intended to include the plural forms as well, unless the context clearly indicates otherwise.

Each embodiment described and exemplified herein may include a complementary embodiment thereof.

FIG. 1 is a schematic block diagram of a memory system according to an exemplary embodiment of the inventive concept. The memory system includes a controller 100 and a memory device 200 including an operation unit 250. A command line L10 to transmit a command, a data line L20 to exchange data, and an address line L30 to transmit an address are coupled between the controller 100 and the memory device 200.

Figure 2:
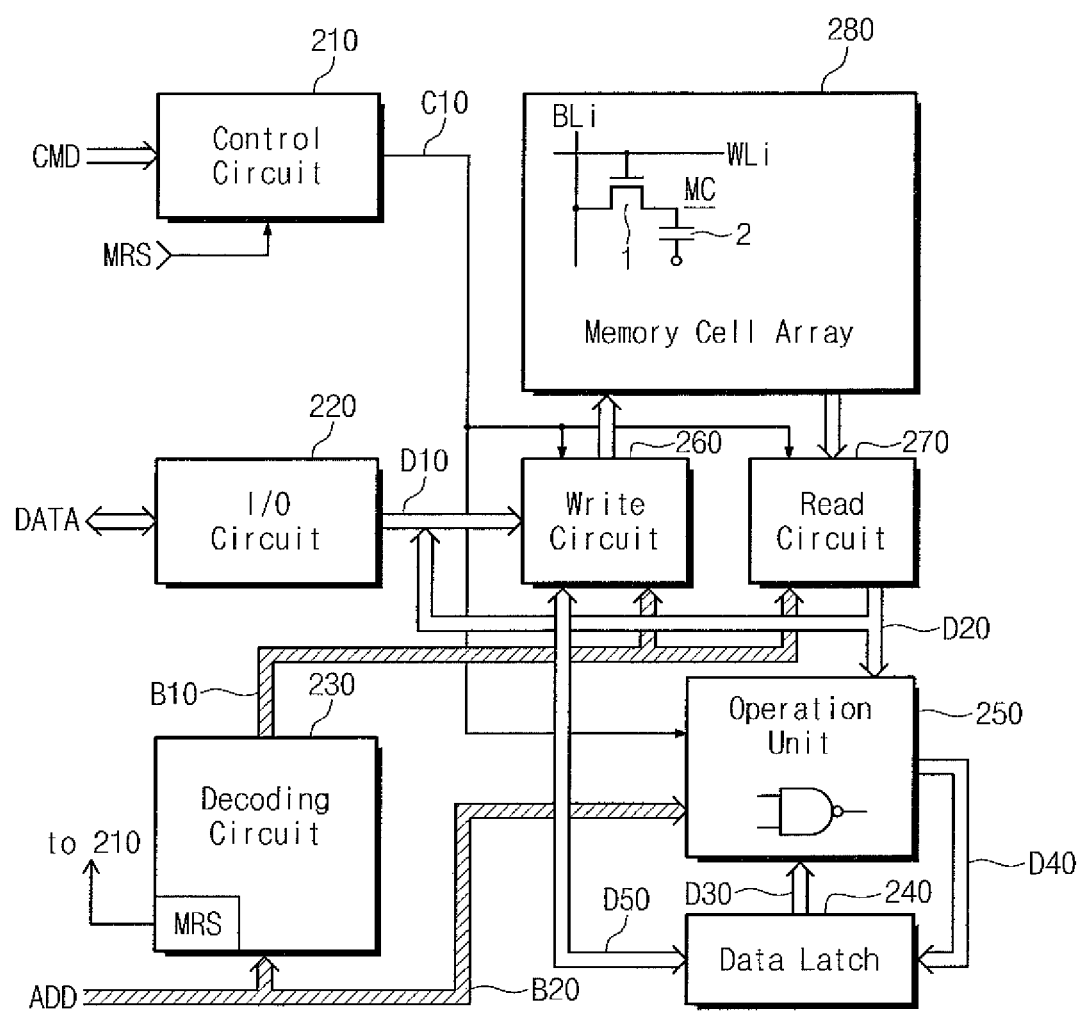
FIG. 2 is a circuit block diagram of a memory device in FIG. 1 according to an exemplary embodiment of the inventive concept.

The memory device 200 may be configured, as shown in FIG. 2, to perform a normal read operation during a normal read mode, a modified read operation during a modified read mode, a normal write operation during a normal write mode, and modified write operation during a modified write mode.

FIG. 2 is a circuit block diagram of the memory device 200 in FIG. 1 according to an exemplary embodiment of the inventive concept. The memory device 200 includes a control circuit 210, an input/output (I/O) circuit 220, a decoding circuit 230, a data latch 240, an operation unit 250, a write circuit 260, a read circuit 270, and a memory cell array 280.

The memory cell array 280 may include a plurality of memory cells MC arranged in a matrix of rows and columns. The memory cell MC may be a DRAM memory cell including a single access transistor 1 and a single storage capacitor 2. A gate of the access transistor 1 may be connected to a wordline WLi, and drain/source thereof may be connected to a bitline BLi. For example, the memory cell array 280 may include a plurality of wordlines and a plurality of bit lines.

The read circuit 270 reads data from selected memory cells in the memory cell array 280.

The write circuit 260 receives write data and writes the received write data into selected memory cells in the memory cell array 280.

When entering the modified read mode, the operation unit 250 performs a modified read operation on read data obtained by the read circuit 270 according to operation assignment information applied through an address line. When entering the modified write mode, the operation unit 250 performs a modified write operation on write data input together with the read data obtained by the read circuit 270 according to operation assignment information applied through an address line. The operation unit 250 may include an ALU (arithmetic logic unit) circuit module and perform corresponding operations in response to a plurality of arithmetic operators and a plurality of logical operators.

The control circuit 210 may optionally manage a normal read mode and the modified read mode and allow operation result data output from the operation unit 250 to be written by the write circuit 260 in the modified read mode. In addition, the control circuit 210 may optionally manage a normal write mode and the modified write mode and allow operation result data output from the operation unit 250 to be written by the write circuit 260 in the modified write mode.

The control circuit 210 receives a command CMD and a mode register set (MRS) signal and controls the write circuit 260, the read circuit 270, and the operation unit 250 through a control bus C10.

The data latch 240 receives the write data through a data bus D50 or applies data latched therein to the write circuit 260. In addition, the data latch 240 latches operation result data through a data bus D40.

The I/O circuit 220 receives the write data and transmits the received write data to a data bus D10, or outputs read data applied through a data bus D20 to the data line L20.

The decoding circuit 230 is connected to the controller 100 through the address line L30 in FIG. 1 and is connected to the write circuit 260 and the read circuit 270 through an address bus B10. The decoding circuit 230 is connected to the operation unit 250 through an address bus B20. The decoding circuit 230 includes an MRS unit and applies a decoded MRS signal to the control circuit 210. The decoding circuit 230 may perform a row address predecoding operation and a column address predecoding operation.

Figure 3:
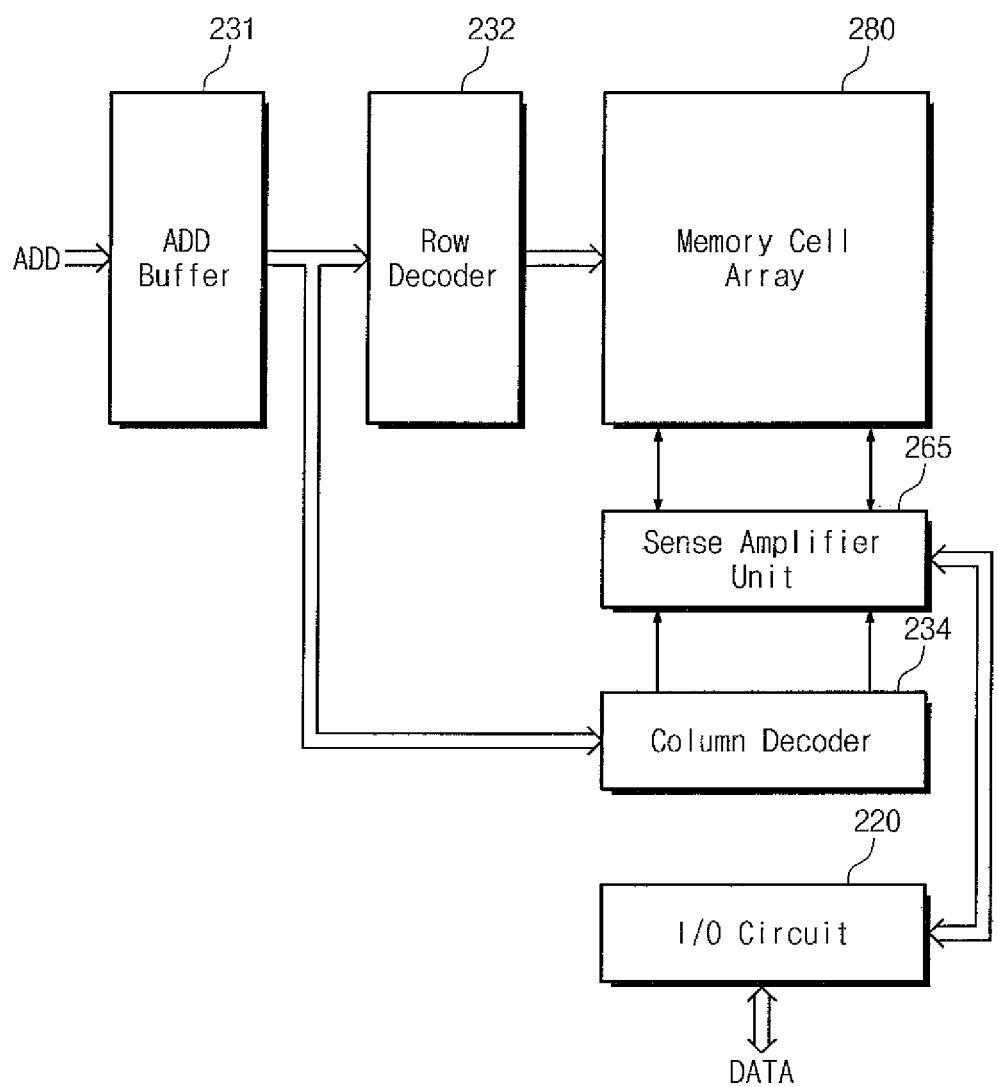
FIG. 3 is a configuration block diagram of read and write circuits in FIG. 2 according to an exemplary embodiment of the inventive concept.

FIG. 3 is a block diagram of the read circuit 270 and the write circuit 260 in FIG. 2 according to an exemplary embodiment of the inventive concept. The read circuit 270 and the write circuit 260 may include an address buffer 231, a row decoder 232, a column decoder 234, and a sense amplifier unit 265.

A read address is applied to the address buffer 231 in a read operation mode. The row decoder 232 decodes the applied read address during a row address apply time period to select a wordline of the memory cell array 280. The column decoder 234 decodes the applied read address during a column address apply time period to select a bitline of the memory cell array 280. Thus, data is read from a memory cell connected to the selected wordline and the selected bitline. The sense amplifier unit 265 senses and amplifies the data read from the memory cell. The sense amplifier unit 265 outputs the amplified read data to the I/O circuit 220. The read data may be applied to the operation unit 250 in FIG. 2 to perform an operation.

A write address is applied to the address buffer 231 in the write operation mode. The write data is provided to the I/O circuit 220. The row decoder 232 decodes the applied write address during a row address apply time period to select a wordline of the memory cell array 280. The column decoder 234 decodes the applied write address during a column address apply time period to select a bitline of the memory cell array 280. The write data may be applied to the operation unit 250 through the data latch 240 in FIG. 2 to perform an operation. Operation result data may be written into selected memory cells through the write circuit 260 after being stored in the data latch 240.

Figure 4:
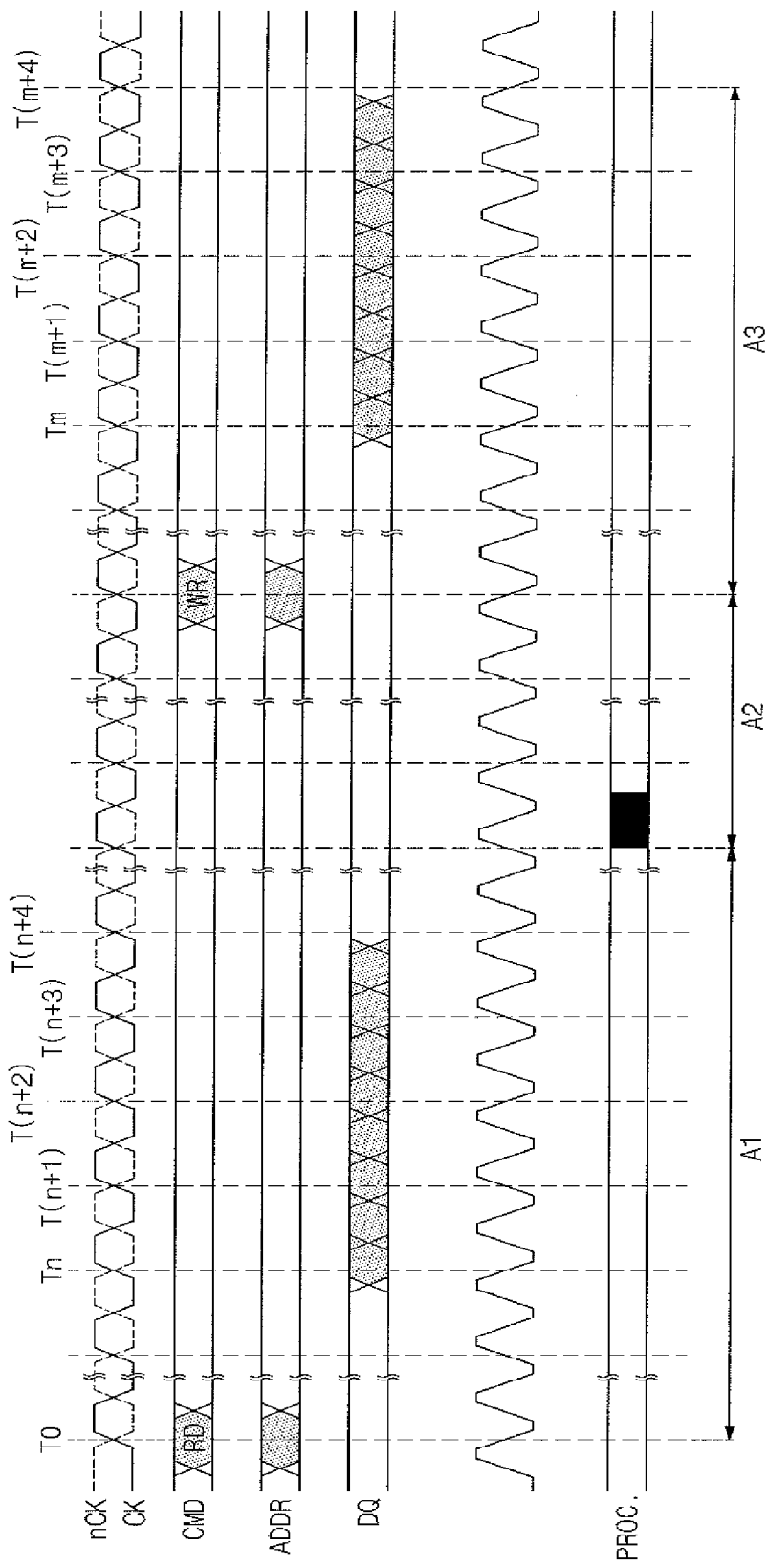
FIG. 4 is a timing diagram of typical read-operate-write operations.

FIG. 4 is a timing diagram of typical read-operate-write operations. When a read command and a read address are applied to a memory device, a read operation is performed during an operation period A1. In this case, the read operation is a normal read operation and data is output from selected memory cells, as indicated by a waveform DQ. The read data is applied to a controller, and the controller performs an operation during an operation period A2 by using the read data as an operand to generate operation result data. The operation result data is applied to a memory device to be written into selected memory cells during an operation period A3. As a result, a controller or a processor accesses the memory device twice in the read-operate-write operation timing of FIG. 4.

In a shared-memory multi-core (or multi-thread) system, read-operate-write operations occur during synchronization between cores (or threads). However, accessing the memory device twice or more during the synchronization makes it difficult to ensure atomicity.

Figure 5:
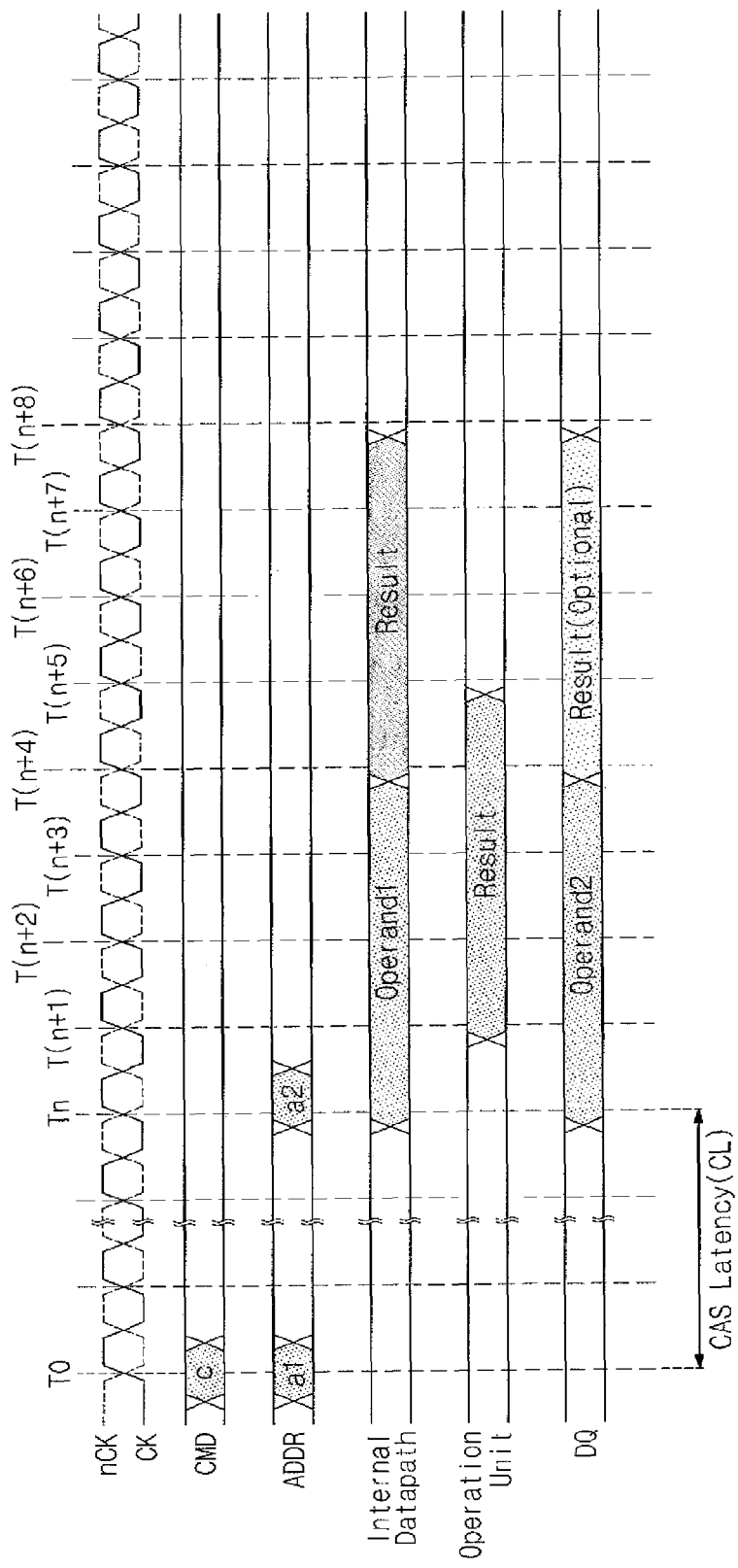
FIG. 5 is a timing diagram of a first modified read operation, which may be performed by the memory system of FIG. 1 according to an exemplary embodiment of the inventive concept.
Figure 6:
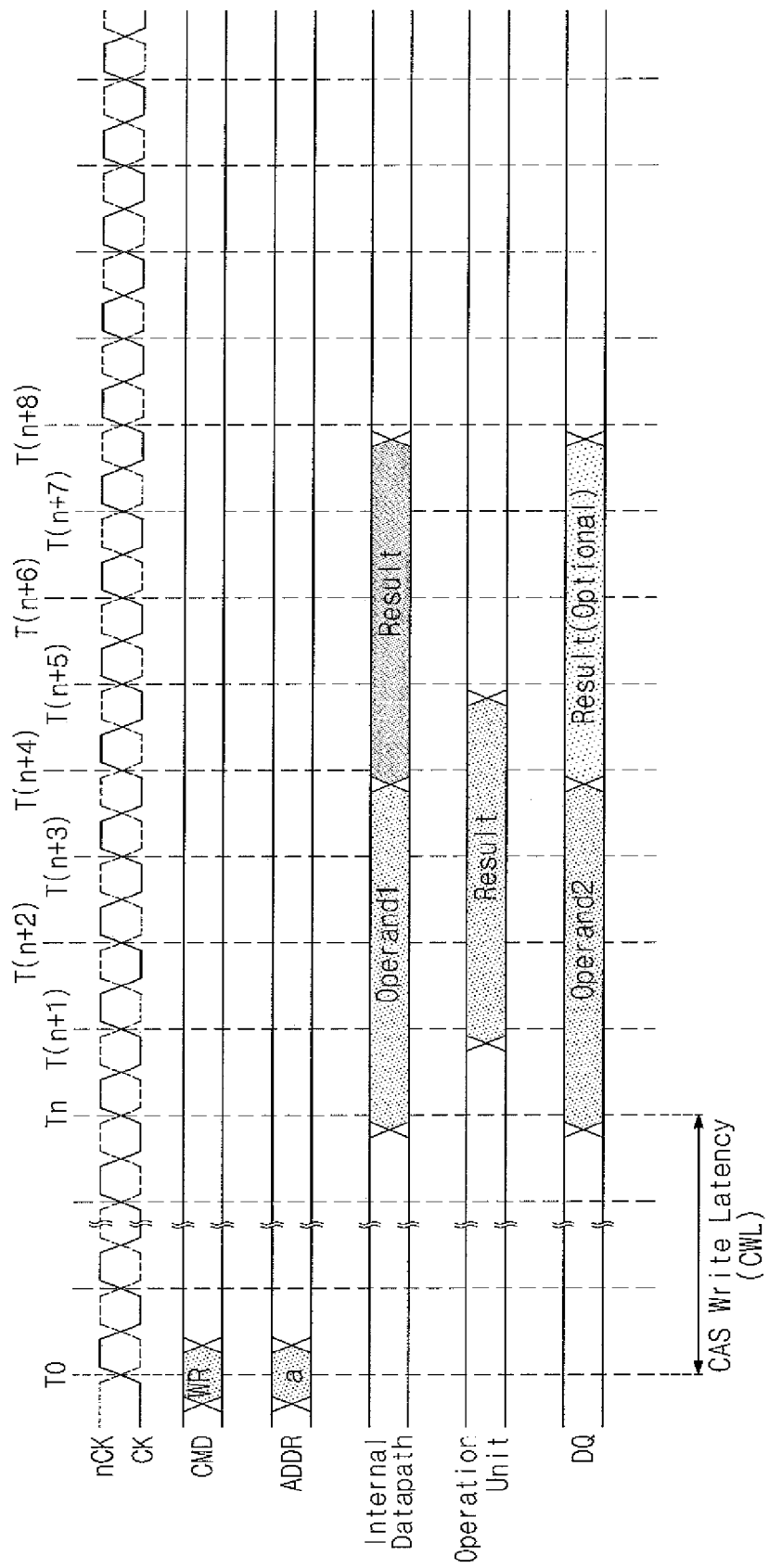
FIG. 6 is a timing diagram of a first modified write operation, which may be performed by the memory system of FIG. 1 according to an exemplary embodiment of the inventive concept.
Figure 7:
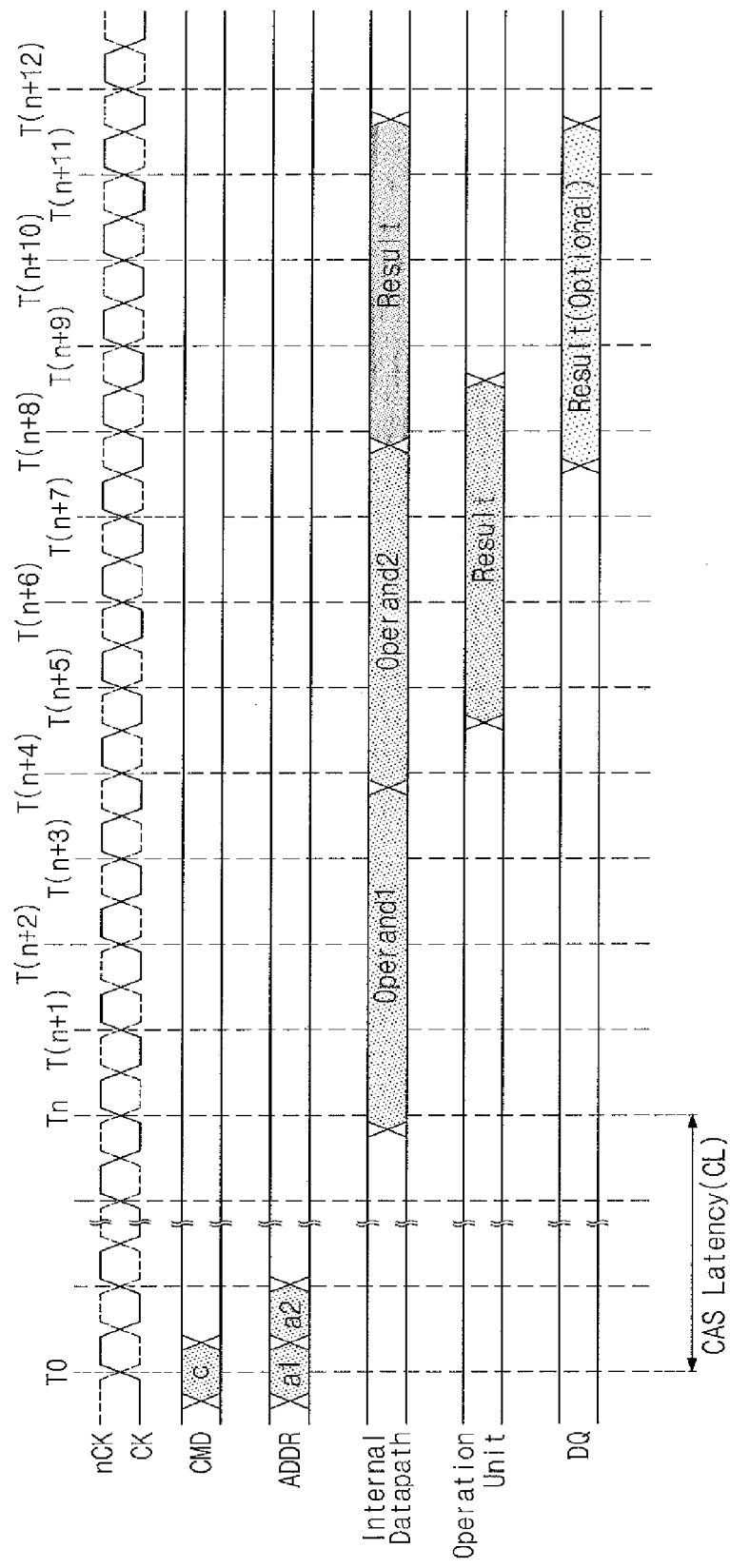
FIG. 7 is a timing diagram of a second modified read operation, which may be performed by the memory system of FIG. 1 according to an exemplary embodiment of the inventive concept.

Accordingly, in at least one exemplary embodiment of the inventive concept, a memory device is accessed only once by performing operations shown in FIGS. 5 to 7.

FIG. 5 is a timing diagram of a first modified read operation according, which may be performed by the memory system of FIG. 1. Referring to FIG. 5, a command "c" and an address "a1" are applied at a clock (CK) T0. An address "a2" is applied at a clock Tn that is generated after a CAS (column address strobe) latency (CL) period has elapsed. The CL period may be a measure of the delay time between the moment a memory controller tells the memory module to access a particular memory column on a RAM module, and the moment the data from the given location is available on the module's output pins.

The command "c" is a command indicating a first modified read operation according to an exemplary embodiment of the inventive concept. The command "c" is different from a normal read operation. For the convenience of explanation, the address "a1" will be referred to as a first input address, and the address "a2" will be referred to as a second input address. The first input address indicates a read address in which a first operand is stored when being applied to an operation unit. The second input address applied after the CAS latency (CL) period has elapsed assigns an operator of operation assignment information.

The operation assignment information may include a plurality of arithmetic operators and a plurality of logical operators, as defined in FIG. 8. For example, the second input address identifies one operator within the operation assignment information, which will be performed on the first operand.

At a period between a clock (CK) Tn and a clock T(n+4), the read circuit 270 in FIG. 2 reads data (e.g., Operand1) stored in memory cells selected by the first input address. The read circuit applies the read data Operand1 to the operation unit 250 in FIG. 2 through a data bus D20. That is, the read data Operand1 becomes a first operand. In FIG. 5, the read data Operand1 is not output to the outside of a memory but exists on an internal data path. For example, the read data Operand1 is not output from the memory device 200 to controller 100.

When entering a first modified read mode, the operation unit 250 performs an operation on the first operand at a clock (CK) T(n+1). In this case, the operation is performed according to operation assignment information assigned through the second input address. When the second input address "a2" assigns an increment operation, a decrement operation, an inverting operation or a shift operation, data of the first operand is incremented, decremented, inverted or shifted to generate operation result data "Result". The operation result data "Result" starts to be stored in the data latch 240 from the point of generating the clock (CK) T(n+1).

When the second input address "a2" assigns an addition, subtraction, multiplication, division, AND, OR, NOR, NAND or exclusive-OR (EXOR) operation, a second operand may be applied to the I/O circuit 220 in FIG. 2 in keeping with the clock (CK) Tn. In the case of the AND operation, the operation unit 250 performs an AND-gating operation on the first operand and the second operand.

The second operand is applied to the operation unit 250 sequentially via the write circuit 260, a data bus D50, and the data latch 240. Thus, in the case of the addition operation, the operation unit 250 adds the second operand to the first operand. The addition result data starts to be stored in the data latch 240 from the point of generating the clock (CK) T(n+1). In the case of AND operation, the operation unit 250 performs an AND-gating operation on the first operand and the second operand. The AND-operation result data starts to be stored in the data latch 240 from the point of generating the clock (CK) T(n+1).

The operation result data "Result" stored in the data latch 240 is output to the write circuit 260 from the point of generating the clock (CK) T(n+4). The write circuit 260 starts to write the operation result data "Result" into memory cells assigned by the first input address from the point of generating the clock (CK) T(n+4). For example, in case of 8 bits of data, the write operation may be performed until the point of generating the clock (CK) T(n+4).

The operation result data may be output to an external entity (e.g., controller 100) through the second 110 circuit 220 during a period from the clock (CK) T(n+4) to the clock (CK) T(n+8).

Entering the modified read mode may be accomplished using one of mode register set timing, fuse programming, NVM (non-volatile memory) programming, and bonding options.

The control circuit 210 may optionally manage a normal read mode and the first modified read mode and allow the operation result data output from the operation unit 250 to be written by the write circuit 260 in the modified read mode.

As described above, it will be understood that the read-operate-write operations are internally performed in the first modified read mode by performing a memory access operation once. For example, for an operation that requires one operand (e.g., an increment), the controller 100 accesses the memory device 200 once to send the memory device 200 a command indicating it should perform a modified read and an address indicating the location of the operand to read and an operation to perform on the operand. For example, for an operation that requires two operands (e.g., AND), the controller 100 accesses the memory device 200 once to send the memory device 200 a command indicating it should perform a modified read, a second operand, and an address indicating the location of a first operand to read and an operation to perform on the first and second operands.

In the foregoing embodiment, the operation result data "Result" is directly written into memory cells indicated by a first input address. However, in an exemplary embodiment, the operation result data "Result" is written into memory cells indicated by part of the second input address or is separately written into an internal register of the semiconductor memory device.

FIG. 6 is a timing diagram of a modified write operation, which may be performed by the memory system of FIG. 1. Referring to FIG. 6, a write command WR and an address "a" are applied at a clock (CK) T0. The write command WR is a command indicating a modified write operation according to an exemplary embodiment of the inventive concept. The modified write operation is different from a normal write operation.

The address "a" indicates an address of the first operand and may be a column address indicating an operator of operation assignment information. In an exemplary embodiment, a lower three bits of the column address identifies the operator and the other bits identify addresses of memory cells in which the first operand is stored. However, the inventive concept is not limited thereto, as a different number of bits of the column address may be used to identify the operator, and the bits may have a different location (e.g., upper or middle portion of column address).

After the CAS write latency (CWL) time has elapsed, a read operation starts. That is, the read circuit 270 in FIG. 2 reads data stored in memory cells selected by the address "a". Read data Operand1 is applied to the operation unit 250 in FIG. 2 through a data bus D20. That is, the read data read during the modified write operation becomes a first operand.

A second operand Operand2 is applied as write data to the I/O circuit 220 in FIG. 2 in keeping with the clock (CK) Tn. The second operand Operand2 is applied to the operation unit 250 sequentially via the write circuit 260, the data bus D50, and the data latch 240.

When entering a modified write mode, the operation unit 250 performs an assigned operation on the first operand and the second operand. In this case, the operation is performed according to operation assignment information assigned through a lower three bits of the column address.

The operation result data starts to be stored in the data latch 240 from the point of generating the clock (CK) Tn+1.

For example, when a lower three bits of the address "a" indicates an addition, subtraction, multiplication, division, AND, OR, NOR, NAND or exclusive-OR (XOR) operation, a corresponding operation is performed. In the case of the addition operation, the operation unit 250 adds the second operand to the first operand. The addition result data starts to be stored in the data latch 240 from the point of generating the clock (CK) T(n+1). In the case of the NAND operation, the operation unit 250 performs a NAND-gating operation on the first operand and the second operand. The NAND-operation result data starts to be stored in the data latch 240 from the point of generating the clock (CK) T(n+1).

The operation result data "Result" stored in the data latch 240 is output to the write circuit 260 from the point of generating a clock (CK) T(n+4). The write circuit 260 starts to write the operation result data into the memory cells identified by the address "a" (e.g., identified its remaining bits) from the point of generating the clock (CK) T(n+4). For example, in case of 8 bits of data, the write operation may be performed until the point of generating a clock (CK) T(n+8).

The operation result data "Result" may be output to an external entity (e.g., controller 100) through the I/O circuit 220 during a period from the clock (CK) T(n+4) to the clock (CK) T(n+8).

Entering the modified write mode may be accomplished using one of mode register set timing, fuse programming, NVM programming, and bonding options.

The control circuit 210 may optionally manage a normal write mode and the first modified write mode and allow the operation result data output from the operation unit 250 to be written by the write circuit 260 in the modified write mode.

As described above, it will be understood that the read-operate-write operations are internally performed in the first modified write mode by performing a memory access operation once.

In the foregoing embodiment, the operation result data "Result" is directly written into memory cells indicated by an address "a". However, in an exemplary embodiment, the operation result data "Result" is written into a corresponding memory cell by applying another address or is separately written into an internal register or a provided multi-purpose register MPR of the semiconductor memory device.

FIG. 7 is a timing diagram of the second modified read operation, which may be performed by the memory system of FIG. 1. Referring to FIG. 7, a command "c" and an address "a" (e.g., including addresses "a1" and "a2") are applied at a clock (CK) T0. An address "a2" is applied during a CAS latency (CL) period. That is, the addresses "a1" and "a2" may be successively applied at an interval of one clock cycle.

The command "c" is a command indicating a second modified read operation according to an exemplary embodiment of the inventive concept. For convenience of explanation, the address "a1" will be referred to as a first input address, and the address "a2" will be referred to as a second input address. The first input address indicates a read address in which a first operand is stored in the memory cell array 280. The second input address assigns an operator of the operation assignment information and indicates an address in which a second operand is stored in the memory cell array 280. For example, the second input address identifies the location of the second operand and identifies an operation to be performed on the first and second operands. In an exemplary embodiment, the part of the second input address that identifies the location of the second operant indicates a column offset with respect to the first input address and may be a modifiable set value or a pre-defined register set value. For example, when a 12-bit address is applied, three bits may identify an operator and the other bits (9 bits) may identify an address in which a second operator is stored. For example, when the first and second input addresses are 12-bits, all 12 bits of the first input address can be used to indicate the location of the first operand, whereas an offset stored only in the upper 9 bits of the second input address can be used to indicate the location of the second operand. For example, if the first input address is 0xffa, and the upper 9 bits of the second input address has a 2 offset, the address of the second operand would be 0xffc.

Accordingly, the operation result data "Result" may be directly written into memory cells indicated by the first input address or written into memory cells spaced apart from the second input address as far as the column offset.

Similarly, the operation assignment information may include a plurality of arithmetic operators and a plurality of logical operators, as defined in FIG. 8.

The read circuit 270 in FIG. 2 reads data stored in memory cells selected by the first input address at a period between a clock (CK) Tn and a clock T(n+4). Read data Operand1 is applied to the operation unit 250 in FIG. 2 through a data bus D20. That is, the read data Operand1 becomes a first operand.

The read circuit 270 in FIG. 2 reads data stored in memory cells selected by the second input address at a period between the clock T(n+4) and a clock T(n+8). Read data Operand2 is applied to the operation unit 250 in FIG. 2 through the data bus D20. That is, the read data Operand2 becomes a second operand.

When entering a first modified read mode, the operation unit 250 receives the first operand and the second operand to perform an operation at a clock (CK) T(n+5). In this case, the operation is performed according to operation assignment information assigned through part of the second input address. The operation result data starts to be stored in the data latch 240 from the point of generating of the clock (CK) T(n+5).

When the address "a2" identifies an addition, subtraction, multiplication, division, AND, OR, NOR, NAND or exclusive-OR (XOR) operation, the operation unit 250 performs the identified operation on the first and second operators. For example, in the case of the addition operation, the operation unit 250 adds the second operand to the first operand. The addition operation result starts to be stored in the data latch 240 from the point of generating the clock (CK) T(n+5). In the case of the AND operation, the operation unit 250 performs an AND-gating operation on the first operand and the second operand. The AND operation result starts to be stored in the data latch 240 from the point of generating the clock (CK) T(n+5).

The operation result data "Result" stored in the data latch 240 is output to the write circuit 260 from the point of generating the clock (CK) T(n+8). The write circuit 260 starts to write the operation result data into memory cells identified by the first input address from the point of generating the clock (CK) T(n+8). For example, in case of 8 bits of data, the write operation may be performed until the point of generating a clock (CK) T(n+12).

The operation result data "Result" may be output to an external entity through the I/O circuit 220 during a period from the clock (CK) T(n+8) to the clock (CK) T(n+12).

Entering the second modified read mode may be accomplished using one of mode register set timing, fuse programming, NVM programming, and bonding options.

The control circuit 210 may optionally manage a normal read mode and the second modified read mode and allow the operation result data output from the operation unit 250 to be written by the write circuit 260 in the second modified read mode.

As described above, it will be understood that the read-operate-write operations are internally performed in the second modified read mode by performing a memory access operation once.

In the foregoing embodiment, the operation result data Result is directly written into memory cells indicated by a first input address. However, in an exemplary embodiment of the inventive concept, the operation result data "Result" is written into memory cells indicated by part of the second input address or a column offset with respect to the first input address or is separately written into an internal register of the semiconductor memory device.

FIG. 8 is an exemplary diagram of an operator table to assign operation assignment information according to FIG. 1. For example, the table lists operations that may be performed by the memory system of FIG. 1, which are identified using a 3 bit address. Referring to FIG. 8, various operators are assigned according to logic states of a lower three bits among an address applied through an address line. For example, a first operator set when the lower three bits of the address are applied as "010" is defined, a second operator set when the lower three bits of the address are applied as "010" is defined, and a seventh operator set when the lower three bits of the address is applied as "111" is defined. The table of FIG. 8 further suggests that third through sixth operator sets are also available and identified by bit patterns other than those already illustrated. The operators may be various arithmetic or logical operators. The arithmetic operators may include, for example, increment (INC), decrement (DEC), addition (ADD), subtraction (SUBTRACT), multiplication (X), and division (÷). The logical operators may include, for example, AND, OR, NOR, NAND, XOR, INVERT, and SHIFT.

When the lower three bits of the address are applied as "000", a normal command is defined and thus a modified read or write operation is not performed.

FIG. 9 is an exemplary diagram of an operation mode table to set memory the memory system of FIG. 1 into one of various operation modes. Referring to FIG. 9, various operation modes are exemplarily identified according to bit logic states of mode register set signals.

For example, when an MRS is 3 bits, one of five different modes M1-M5 may be exemplarily set according to an exemplary embodiment of the inventive concept. For example, a first mode M1 in which the MRS is set to "000" defines a normal read operation. Thus, the control circuit 210 in FIG. 2 controls a normal read operation to output data read through a sense amplifier circuit to an external entity.

For example, a second mode M2 in which the MRS is set to "001" defines a first modified read operation. Thus, the control circuit 210 in FIG. 2 may control read-operate-write operations, as set forth in the embodiment described with reference to FIG. 5. In this case, a controller performs a memory access once.

For example, a third mode M3 in which the MRS is set to "010" defines a second modified read operation. Thus, the control circuit 210 in FIG. 2 may control read-operate-write operations, as set forth in the embodiment described with reference to FIG. 7. In this case, a controller performs a memory access once.

For example, a fourth mode M4 in which the MRS is set to "011" defines a normal write operation. Thus, the control circuit 210 in FIG. 2 may control a normal write operation to store write data in selected memory cells.

For example, a fifth mode M5 in which the MRS is set to "111" defines a modified write operation. Thus, the control circuit 210 in FIG. 2 may control read-operate-write operations, as set forth in the embodiment described with reference to FIG. 6. In this case, a controller applies an address once and performs a memory access once.

The definitions provided in FIG. 9 are merely examples, as the inventive concept is not limited thereto. For example, the modes may be represented by different bit patterns and a different number of bits from those illustrated by in FIG. 9.

Figure 10:
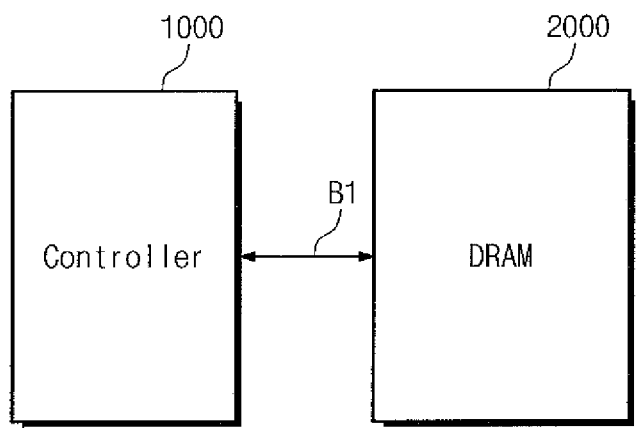
FIG. 10 is a block diagram illustrating an application example of at least one embodiment of the inventive concept being applied to a memory system.

FIG. 10 is a block diagram illustrating an application example of at least one embodiment of the inventive concept being applied to a memory system. As shown, a memory system may include a controller 1000 and a dynamic random access memory (DRAM) 2000.

The controller 100 may be connected to a host (not shown) through a determined interface.

The DRAM 2000 may have the same configuration as shown in FIG. 2.

Accordingly, the controller 1000 may perform read-operate-write operations by accessing the DRAM 2000 once. As a result, an assigned operation is performed in the DRAM 2000 to reduce memory access time. In addition, since an operator may be assigned using an address line, a packet for transferring the operator need not be separately defined.

Figure 11:
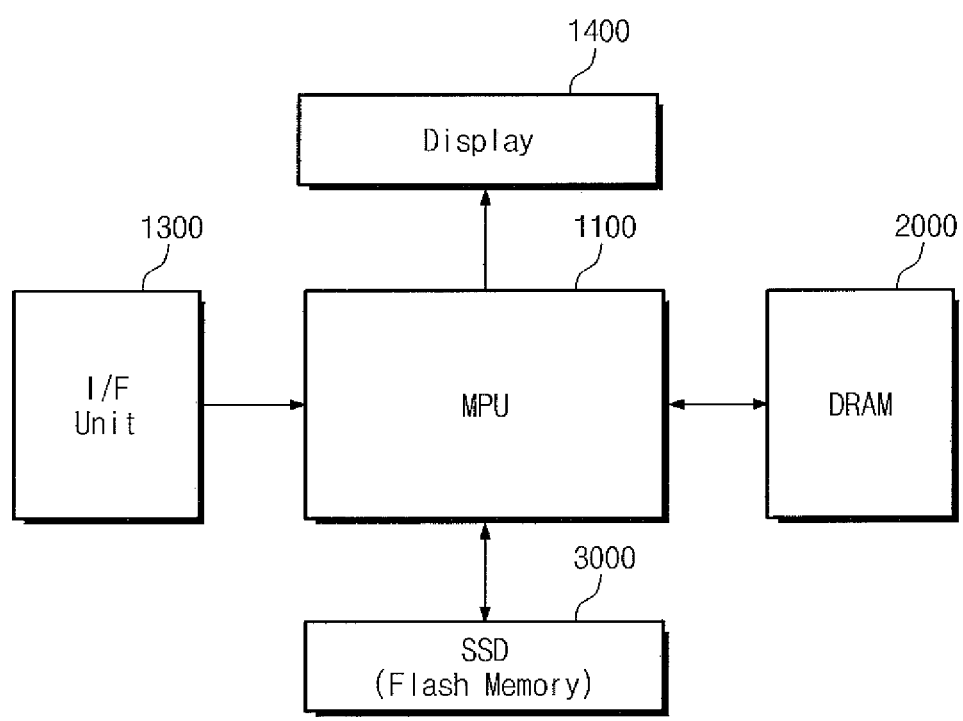
FIG. 11 is a block diagram illustrating an application example of at least one embodiment of the inventive concept being applied to a mobile device.

FIG. 11 is a block diagram illustrating an application example of at least one embodiment of the inventive concepts being applied to a mobile device. As shown, a mobile device includes a microprocessing unit (MPU) 1100, a display 1400, an interface unit 1300, a DRAM 2000, and a solid state drive (SSD) 3000.

The MPU 1100, the DRAM 2000, and the SSD 3000 may be manufactured or packaged on a single chip. Consequently, the DRAM 2000 and the SSD 3000 may be embedded on the mobile device.

If the mobile device is a mobile communication device, a modem and a transceiver may be connected to the interface unit 1300 to fulfill modulation/demodulation functions and transmit/receive communication data.

The MPU 1100 controls the overall operation of the mobile device according to predetermined programs.

The DRAM 2000 may be connected to the MPU 1100 through a system bus and function as a buffer memory or a main memory of the MPU 1100.

Although the MPU 1100 accesses the DRAM 2000 once, the MPU 1100 may perform read-operate-write operations. Thus, an assigned operation is performed in the DRAM 2000 to reduce memory access time. In addition, since an operator may be assigned using an address line, a packet for transferring the operator need not be separately defined. As a result, reliability and operation performance of the mobile device may be enhanced.

The flash memory 3000 may be a NOR-type flash memory or a NAND-type flash memory.

The display 1400 may be a device such as a liquid crystal display with a backlight, a liquid crystal display with an LED (light emitting diode) light source or an OLED (organic LED) and include a touch screen. The display 1400 functions as an output device to display images such as characters, numbers, and figures in color.

Although the mobile device has been, described with a focus on a mobile communication device, the mobile device may function as a smart card by adjusting (i.e., adding or subtracting) elements, if necessary.

The mobile device may be connected to an external communication device through a separate interface. The communication device may be a digital versatile disc (DVD) player, a computer, a set top box (STB), a game console, a digital camcorder or the like.

Although not shown in the figure, the mobile device may further include an application chipset, a camera image processor (CIS), a mobile dynamic random access memory (DRAM), and the like.

The DRAM (2000) chip or the flash memory (3000) chip may be packaged as one of various types to be subsequently embedded. For example, a chip may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Although a flash memory is adopted as an example in FIG. 11 of the SSD, various types of nonvolatile storages may be used.

The nonvolatile storage may store data information having various data formats such as texts, graphics, software codes, and the like.

The nonvolatile storage may be, for example, an electrically erasable programmable read-only memory (EEPROM), a flash memory, a magnetic RAM (MRAM), a spin-transfer torque MRAM, a conductive bridging RAM (CBRAM), a ferroelectric RAM (FeRAM), a phase change RAM (PRAM or also known as ovonic unified memory (OUM)), a resistive RAM (RRAM or ReRAM), a nanotube RRAM, a polymer RAM (PoRAM), a nano floating gate memory (NFGM), a holographic memory, a molecular electronics memory device) or an insulator resistance change memory.

Figure 12:
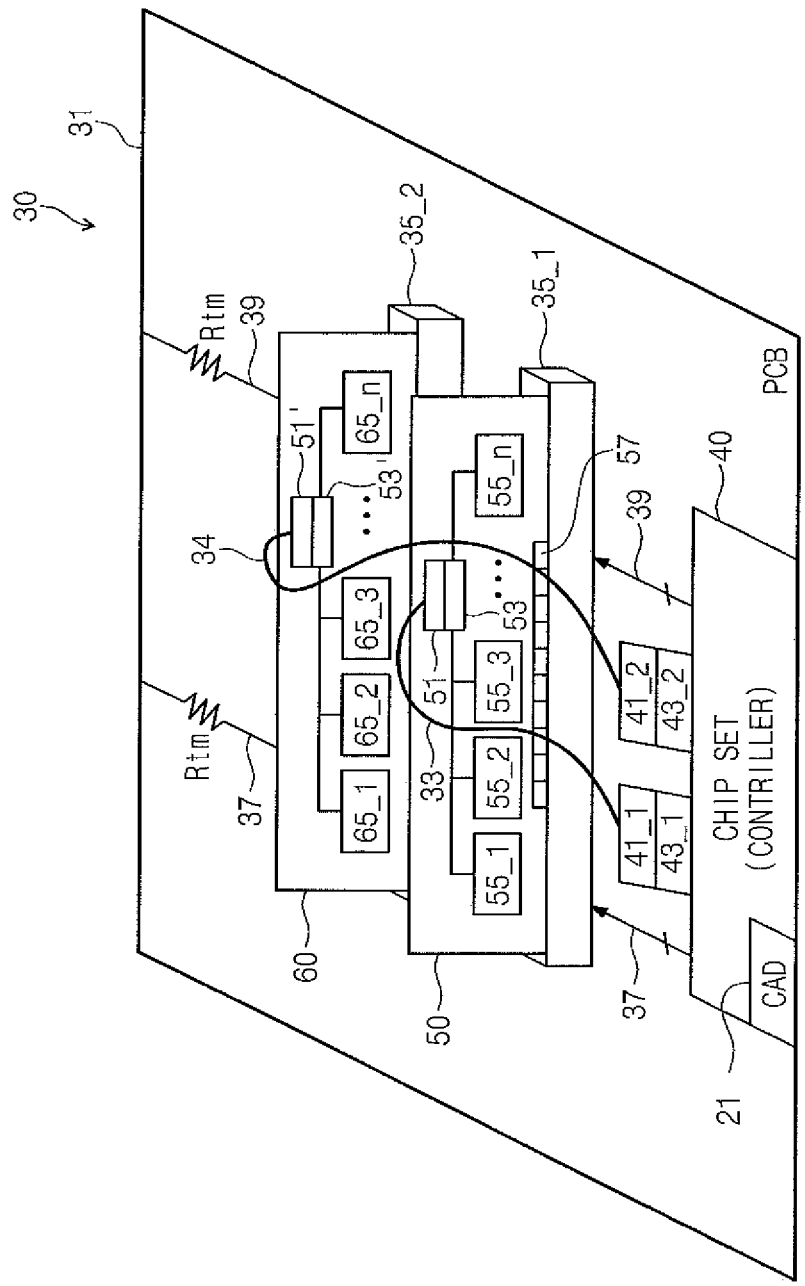
FIG. 12 is a block diagram illustrating an application example of at least one of embodiment of the inventive concept being applied to an optical I/O schema.

FIG. 12 is a block diagram illustrating an application example according to an exemplary embodiment of the inventive concepts being applied to an optical I/O schema. As shown, a memory system 30 adopting a high-speed optic I/O includes a chipset 40 as a controller mounted on a printed circuit board (PCB) 31 and memory modules 50 and 60. The memory modules 50 and 60 are inserted into slots 35_1 and 35_2 formed on the PCB 31, respectively. The memory module 50 includes a connector 57, DRAM memory chips 55_1-55_n, an optical I/O input unit 51, and an optical I/O output unit 53.

The optical I/O input unit 51 may a photoelectric conversion element (e.g., photodiode) to convert an applied optical signal into an electrical signal. Thus, an electrical signal output from the photoelectric conversion element is transmitted to the memory module 50. The optical I/O output unit 53 may include an electro-optical conversion element (e.g. laser diode) to convert an electrical signal output from the memory module 50 into an optical signal. If necessary, the optical I/O output unit 53 may further include an optical modulator to modulate a signal output from a light source.

An optical cable 33 is in charge of optical communication between the optical I/O input unit 51 of the memory module 50 and an optical transmission unit 41_1 of the chipset 40. The optical communication may have a bandwidth of tens of gigabytes or more per second. The memory module 50 may receive signals or data applied from signal lines 37 and 39 of the chipset and perform high-speed data communication with the chipset 40 through the optical cable 33. Resistors Rtm formed on lines 37 and 39 are termination resistors.

As shown in FIG. 12, even in case of the memory system 30 adopting an optical I/O structure, the DRAM memory chips 55_1-55_n according to at least one embodiment of the inventive concept may be mounted. In an exemplary embodiment of the inventive concept, each DRAM memory chip (e.g., 55_1-55_n) is the memory device illustrated in FIG. 2 and the chipset 40 is configured to output data to the memory chips like the data output by the controller 100 to memory device 200.

Thus, the chipset 40 may perform read-operate-write operations even when accessing the DRAM memory chips 55_1-55_n once. As a result, since an assigned operation is performed in the DRAM memory chips 55_1-55_n, memory access time may be reduced. In addition, since an operator may be assigned using an address line, a packet for transferring the operator need not be separately defined. Thus, reliability and operation performance of the memory system 30 may be enhanced.

In FIG. 12, the chipset 40 may include a concentrated access detector 21. The concentrated access detector 21 generates a concentrated access detection signal when the application number of a frequently applied address exceeds a predetermined threshold value.

The chipset 40 may prevent or mitigate corruption of data stored by memory cells in memory regions adjacent to a specific memory region when the concentrated access detection signal is generated.

For example, when a specific wordline, a specific bitline or a specific memory block of a nonvolatile semiconductor memory such as a DRAM is concentrically accessed, memory cell data may be corrupted. That is, data stored in wordlines adjacent to a specific wordline, bitlines adjacent to a specific bitline or memory cells of a memory block adjacent to a specific memory block may disappear due to concentrated access of their cell data. Accordingly, there is a need for eliminating or avoiding the address concentration to prevent or mitigate loss of cell data.

When the DRAM memory chips 55_1-55_n of the memory modules 50 and 60 are accessed in units of memory pages, columns or banks, the concentrated access detector 21 monitors concentrated access.

When the memory system in FIG. 12 is a solid-state drive (SSD), the DRAM memory chips 55_1-55_n may be used as a user data buffer.

Figure 13:
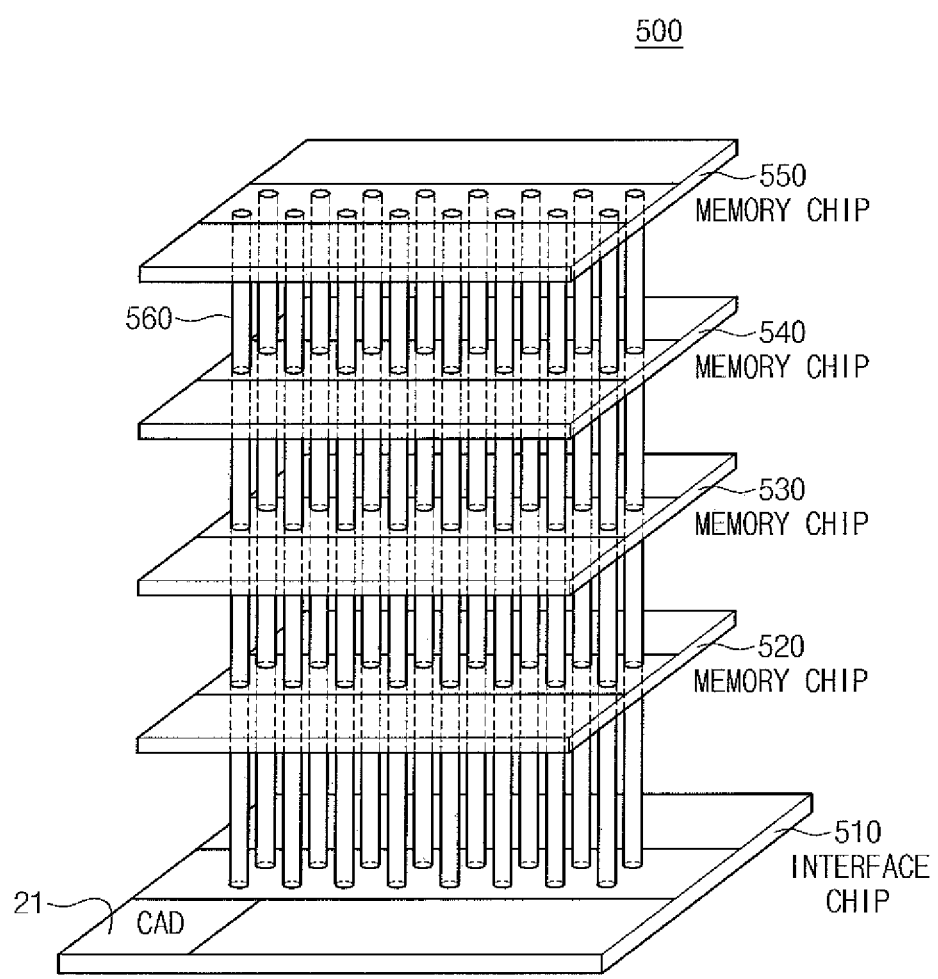
FIG. 13 is a block diagram illustrating an application example of at least one of embodiment of the inventive concept being applied to a through-silicon via (TSV).

FIG. 13 is a block diagram illustrating an application example according to at least one embodiment of the inventive concepts being applied to a through-silicon via (TSV). Referring to a structure of a stacked memory device 500 in FIG. 13, a plurality of memory chips 520, 530, 540, and 550 are vertically stacked on an interface chip 510. A plurality of through-silicon vias 560 are formed through the memory chips 520, 530, 540, and 550. A three-dimensional stacked package type memory device 500 where a plurality of memory chips are vertically stacked on the interface chip 510 by means of a TSV technique may enable high speed communication, low power consumption, and miniaturization while storing a large amount of data.

Even in the case of the stacked memory device in FIG. 13, since the interface chip 510 may include a concentrated access detector 21, corruption of data stored in DRAMs in the memory chips 520, 530, 540, and 550 may be efficiently prevented or mitigated.

In a stacked memory device as shown in FIG. 13, DRAMs according to at least one embodiment of the inventive concept may be stacked in the form of a chip. Thus, since modified read modes or modified write modes may be performed in addition to a normal read mode and a normal write mode, reliability and performance of the stacked memory device may be enhanced.

As described so far, since an operation is performed in a memory device, memory access time is reduced. In addition, since an operator can be assigned using an address line, a packet for transferring the operator need not be defined.

While the inventive concept has been particularly shown and described with reference to exemplary embodiments thereof, it will be apparent that various changes in form and detail may be made therein without departing from the spirit and scope of the inventive concept.

What is claimed is:

1. A semiconductor memory device comprising:
a memory cell array including a plurality of memory cells;
a read circuit configured to read data from selected memory cells in the memory cell array;
a write circuit configured to write data into selected memory cells in the memory cell array;
an operation unit configured to perform an operation on read data obtained by the read circuit according to operation assignment information applied through an address line when entering a modified read mode; and
a control circuit configured to manage a normal read mode and the modified read mode and allow operation result data output from the operation unit to be written by the write circuit into the selected memory cells in the modified read mode,
wherein during the modified read mode, a second input address identifying an operator and indicating an address storing a second operand is received after a first input address indicating an address storing a first operand to be applied to the operation unit, wherein the second input address comprises a first part that identifies the operator and a second other part that indicates the address storing the second operand, and the second part is a column offset with respect to the first input address.

2. The semiconductor memory device as set forth in claim 1, wherein a read-operate-write operation is performed internally within the semiconductor memory device in response to a single request from an external source.

3. The semiconductor memory device as set forth in claim 1, wherein entering the modified read mode is accomplished using one of mode register set timing, fuse programming, NVM programming, and bonding options.

4. The semiconductor memory device as set forth in claim 1, wherein the operation result data is directly written into memory cells indicating the first input address or is written into memory cells spaced apart from the second input address as far as the column offset.

5. The semiconductor memory device as set forth in claim 1, wherein the operation result data is directly written into memory cells indicated by the first input address, is written into memory cells indicated by part of the second input address, or is written into an internal register of the semiconductor memory device.

6. The semiconductor memory device as set forth in claim 5, wherein data output to an external entity through the read circuit is the read data or the operation result data.

* * * * *